(12) United States Patent
Kwok

(10) Patent No.: US 9,172,399 B2
(45) Date of Patent: Oct. 27, 2015

(54) UPDATING VARIABLE NODES ASSOCIATED WITH AN ITERATIVE DECODER

(75) Inventor: Zion S. Kwok, Burnaby (CA)

(73) Assignee: Intel Corporation, Santa Clara, CA (US)

(*) Notice: Subject to any disclaimer, the term of this patent is extended or adjusted under 35 U.S.C. 154(b) by 90 days.

(21) Appl. No.: 13/997,195

(22) PCT Filed: Mar. 28, 2012

(86) PCT No.: PCT/US2012/031035
§ 371 (c)(1),
(2), (4) Date: Jun. 21, 2013

(87) PCT Pub. No.: WO2013/147777
PCT Pub. Date: Oct. 3, 2013

(65) Prior Publication Data
US 2013/0339817 A1 Dec. 19, 2013

(51) Int. Cl.
*H03M 13/00* (2006.01)
*H03M 13/05* (2006.01)
*H03M 13/11* (2006.01)

(52) U.S. Cl.
CPC .......... *H03M 13/05* (2013.01); *H03M 13/1111* (2013.01); *H03M 13/1117* (2013.01); *H03M 13/1171* (2013.01); *H03M 13/6525* (2013.01); *H03M 13/6527* (2013.01)

(58) Field of Classification Search
CPC ..................... H03M 13/1171; H03M 13/6525; H03M 13/6527
See application file for complete search history.

(56) References Cited

U.S. PATENT DOCUMENTS

| | | | |
|---|---|---|---|
| 8,132,080 B2 | 3/2012 | Matsumoto et al. | |
| 8,140,930 B1 | 3/2012 | Maru | |
| 2006/0123318 A1 | 6/2006 | Kim et al. | |
| 2006/0192691 A1* | 8/2006 | Kan et al. | 341/50 |
| 2008/0294960 A1* | 11/2008 | Sharon et al. | 714/752 |
| 2010/0077278 A1* | 3/2010 | Wang et al. | 714/752 |
| 2011/0051831 A1 | 3/2011 | Subrahmanya et al. | |

OTHER PUBLICATIONS

International Search Report and Written Opinion for PCT/US2012/031035, mailed Nov. 29, 2012, 6 pages.
International Preliminary Report on Patentability for corresponding PCT/US2012/031035, mailed Oct. 9, 2014, 5 pages.

* cited by examiner

*Primary Examiner* — Sam Rizk
(74) *Attorney, Agent, or Firm* — Schwabe, Williamson & Wyatt, P.C.

(57) ABSTRACT

In various embodiments, an iterative decoder may compute, from sign bits of log likelihood ratios associated with x bits of a plurality of bits of encoded data, a first combination of the x bits having a higher associated log density ratio than any other combination of the x bits. In various embodiments, the iterative decoder may further be configured to compute m combinations of the x bits having m highest associated log density ratios, based on reductions in log density ratios associated with one or more sub-combinations of the x bits and the computed first combination of the x bits. In various embodiments, a variable node associated with the iterative decoder may be updated with the m combinations of the x bits.

25 Claims, 6 Drawing Sheets

UPDATING VARIABLE NODES ASSOCIATED WITH AN ITERATIVE DECODER

CROSS REFERENCE TO RELATED APPLICATION

The present application is a national phase entry under 35U.S.C. §371 of International Application No. PCT/US2012/031035, filed Mar. 28, 2012, entitled "UPDATING VARIABLE NODES ASSOCIATED WITH AN ITERATIVE DECODER," which designates, among the various States, the United States of America, and the entire contents and disclosures of which are hereby incorporated by reference in their entireties.

FIELD

Embodiments of the present invention relate generally to the field of data processing, and more particularly, to updating variable nodes associated with iterative decoders.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section. An error correction code ("ECC") decoder may be used to decode pluralities of encoded bits, also referred to as "codewords," on a channel. For example, a memory controller may use an ECC decoder to handle bit errors and recover data associated with an ECC codeword stored in non-volatile memory ("NVM"). As another example, an ECC decoder may be used to handle bit errors and recover data associated with an encoded incoming data on a wired or wireless communication channel.

An iterative decoder such as a non-binary low-density parity-check ("LDPC") decoder may process a codeword multiple times. Each iteration may bring the codeword closer to the original data. In one form of iterative decoding called "extended min-sum," symbols and associated probabilities that the symbols are correct may be passed between variable nodes and check nodes corresponding to relationships between the variable nodes. During iterative decoding, a predetermined number m of symbols having the highest associated probabilities may be computed for various purposes, such as variable node updating.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be implemented. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smart phone (which may include one or more processors), a tablet computer, laptop computer, a set-top box, a gaming console, and so forth.

Figure 1:
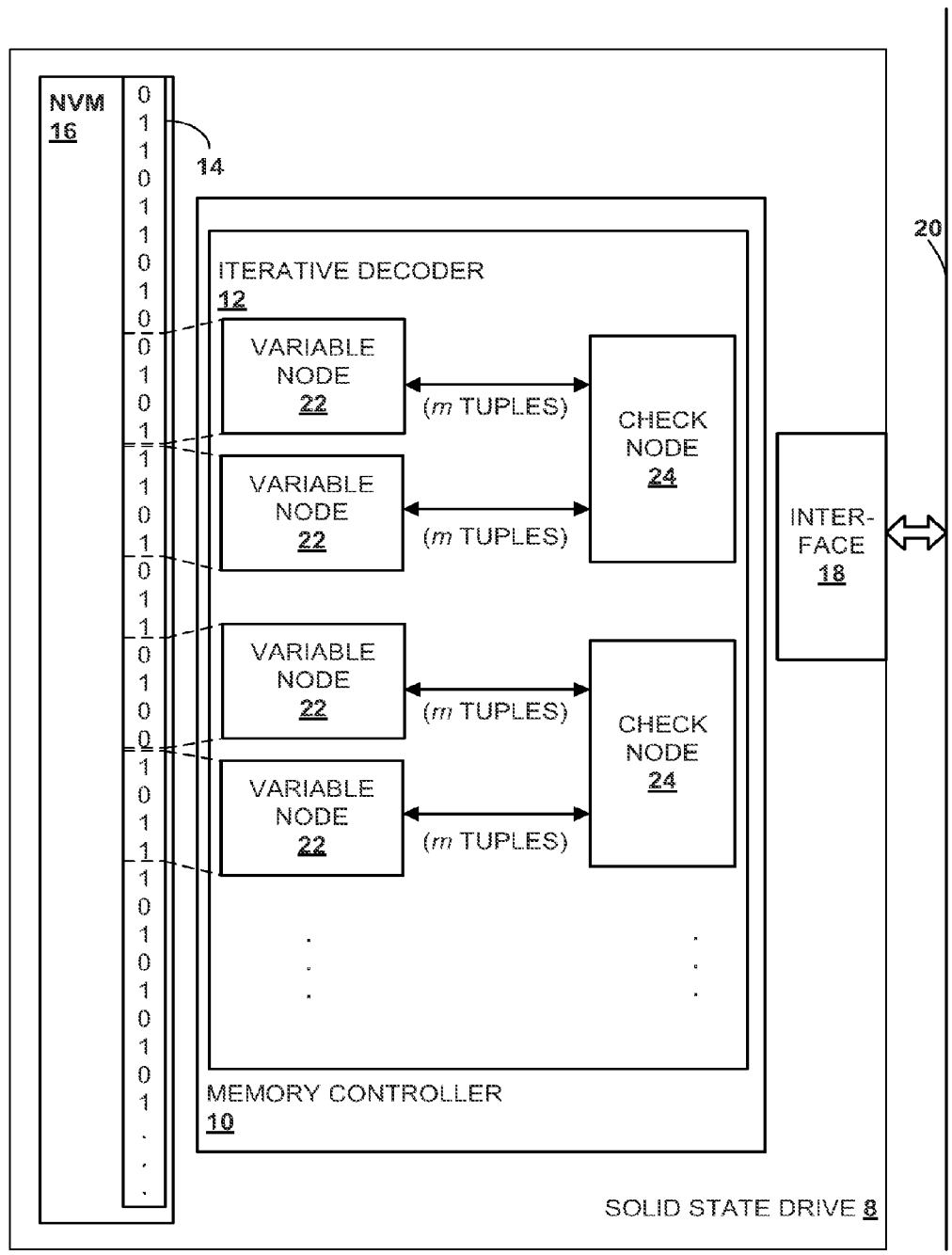
FIG. 1 schematically depicts an example solid state drive that includes non-volatile memory and an iterative decoder, in accordance with various embodiments.

Referring now to FIG. 1, a memory device 8, shown here in the form of a solid state drive ("SSD"), may include a memory controller 10. Memory controller 10 in turn may include an iterative decoder 12 configured to decode encoded data, e.g., a "codeword," on a channel 14 of non-volatile memory 16. In various embodiments, memory controller 10 may be separate from but operably coupled to iterative decoder 12. In various embodiments, memory device 8 may be another type of memory device, such as a hard disk drive ("HDD"). In various embodiments, iterative decoder 12 may be an LDPC decoder, and the codewords on channel 14 may have been encoded with an LDPC encoder (not shown). Other iterative encoding/decoding schemes also may be used.

In various embodiments, memory device 8 may be configured to be coupled to a host computing device (not shown), such as various computing and/or consumer electronic devices/appliances, including but not limited to desktop, laptop, or tablet computers. To that end, an interface 18 may comprise any suitable interface for coupling the memory device 10 to the host computing device, such as, for example, but not limited to, a Serial Advanced Technology Attachment ("SATA") interface, a serial attached SCSI ("SAS") interface, a universal serial bus ("USB") interface, a peripheral control interface ("PCI"), or other suitable device interface. In various embodiments, interface 18 may operably couple memory device 10 to a bus 20, which in turn may be operably coupled to other components (not shown) of the host computing device. In various embodiments, bus 20 may be a SATA bus.

In addition to a channel of memory, in various other embodiments, channel 14 may be any medium capable of storing or transmitting data, including but not limited to a wired or wireless communication channel. For example, LDPC decoding may be used in various wireless communication standards, such as Wi-Fi (IEEE 802.11 family), WiMAX (IEEE 802.16 family), 10 Gigabit Ethernet ("10GE" or "10GbE"), and so on. LDPC decoding could also be used with other wireless standards, such as Long Term evolution ("LTE"), 3G, 4G, 5G, and beyond. In such cases, channel 14 may hold data received over such a wireless medium.

Regardless of the nature of channel 14, iterative decoder 12 may be configured to divide the codeword among a plurality of variable nodes 22. In binary LDPC decoders, each variable node 22 may be a single bit to store a logical one or a logical zero. In non-binary LDPC decoders, such as iterative decoder 12 in FIG. 1, each variable node 22 may represent a group of bits, and each group may form a q-ary symbol. In either case, the variable nodes 22 may be related or relatable to each other by a plurality of check nodes 24.

Soft information such as a probability that each bit and/or group of bits is correct may be generated as input for iterative decoder 12. For instance, various reference voltages may be applied to a cell of non-volatile memory to determine a probability that an initial read of the cell's data is correct. In single-level cell ("SLC") embodiments, the cell may hold a single bit of data (e.g., zero or one). In multi-level cell ("MLC") embodiments, more than one bit may be stored in each cell, and the value of the multiple bits may be determined by choosing between multiple levels of electrical charge to apply to floating gates of the cell.

In various embodiments, the probability may be represented in logarithmic form. A log likelihood ratio ("LLR") may be associated with each bit in the symbol and may represent the likelihood that the bit is a one or a zero. A log density ratio ("LDR") may be associated with groups of bits and may represent the likelihood that the symbol represented by the group of bits is correct.

In various embodiments, an LDR of a symbol formed from a group of bits may be computed using the LLRs for each bit in the group of bits. For instance, the LDR for the group of bits may be normalized by the probability that the group of bits is zero. If all bits are zero, then the LDR of the symbol formed by the group of bits may be zero. If one of the bits is one and the rest are zero, then the LDR of the symbol formed by the group of bits may be equal to a negated LLR of the single one-bit. If more bits are equal to one, then the LDR of the symbol formed by the group of bits may be equal to a sum of the negated LLRs of the one-bits. An LLR may be either positive or negative, and so a negated LLR may also be positive or negative. Thus, in various embodiments, computing an LDR of a symbol formed by a group of bits may include adding the negated LLR for every bit that is equal to one.

In various embodiments, multiple possible bit combinations, or symbols, that may be formed from a group of bits may be computed, as well as LDRs associated with those possible bit combinations. Although computing LDRs for all possible combinations of a group of bits may be relatively straightforward, it may also require considerable computing resources. In some iterative decoders, such as non-binary LDPC decoders that implement the extended min-sum algorithm, it may only be necessary to compute m possible bit combinations, or symbols, having the highest LDRs, e.g., to update a variable node 22. In various embodiments, m may be an integer greater than zero ($m \in$).

Accordingly, techniques described herein may facilitate efficient computation of the m bit combinations, or q-ary symbols of $\log_2 q$ bits, having the highest associated LDRs. In various embodiments, this may enable efficient generation of LDRs from LLRs, so that the LDRs can be computed as needed, instead of being pre-computed and stored. Additionally, techniques described herein provide for a methodical, recursive approach to generating LDRs that may simplify design of memory if, for instance, in is changed.

As used herein, the terms "bit combinations," "combination of bits" and "symbol" may be synonymous. In various embodiments described herein, x bits may refer to any number of bits, such as $\log_2 q$ bits forming a q-ary symbol. In various embodiments, iterative decoder 12 may be a non-binary LDPC decoder configured to implement these techniques at various stages of processing, e.g., during update of a variable node 22.

In various embodiments, iterative decoder 12 may compute a first combination of x bits having a higher associated LDR than any other combination of the x bits. In various embodiments, iterative decoder 12 may compute the first combination of the x bits having the highest LDR based on sign bits of LLRs associated with the x bits on channel 14. For instance, when the LLR for a particular bit is positive, 0>-LLR for that bit, and so that bit may be set to zero. When the LLR for a given bit is negative, 0<-LLR for that bit, and so that bit may be set to one. Thus, in various embodiments, the symbol having the highest LDR may be determined from the sign bits of the constituent bits.

In various embodiments, once the bit combination having the highest LDR is computed, iterative decoder 12 may compute m combinations of the x bits having the highest associated log density ratios (which would include the bit combination having the highest LDR). In various embodiments, iterative decoder 12 may compute the in combinations of the x bits based at least in part on the bit combination having the highest LDR, in addition to other data, as will be described below.

In various embodiments, symbols having the next highest LDRs may be symbols with one-bit differences from the symbol having the highest LDR. After that, symbols having the next highest LDRs may be symbols with two-bit differences from the symbol having the highest LDR, and so on. It is possible to compute all possible symbols and their associated LDRs in this manner. However, as noted above, for various decoding algorithms such as extended min-sum, only the m symbols having the highest LDRs are needed.

Accordingly, rather than enumerating all possible symbols and associated LDRs, in various embodiments, iterative decoder 12 may compute the m combinations of the x bits having m highest associated log density ratios based on reductions in LDRs associated with one or more sub-combinations of the x bits and/or symbol differences associated with the one or more sub-combinations. A "reduction in log density ratio" or "reduction in LDR" may refer to a difference between an LDR of a combination or sub-combination of the x bits and an LDR of a corresponding bit combination or sub-combination of the symbol having the highest LDR. A "symbol difference" may refer to a difference between a combination or sub-combination of the x bits under consideration and a corresponding bit combination or sub-combination of the symbol having the highest LDR.

In various embodiments, computing m combinations of the x bits having m highest associated LDRs may include comparing, by iterative decoder 12, reductions in log density ratios associated with one or more combinations of a first subset of the x bits with reductions in log density ratios associated with one or more combinations of a second subset of the x bits. For instance, iterative decoder 12 may utilize a "divide and conquer" algorithm to recursively divide the x bits into subsets of ever-decreasing size, e.g., until subsets of two bits are reached. Then, beginning at the smallest subsets and working backwards, iterative decoder 12 may compare reductions in LDRs between subsets of ever-increasing sizes, until iterative decoder 12 is back at x bits.

Figure 2:
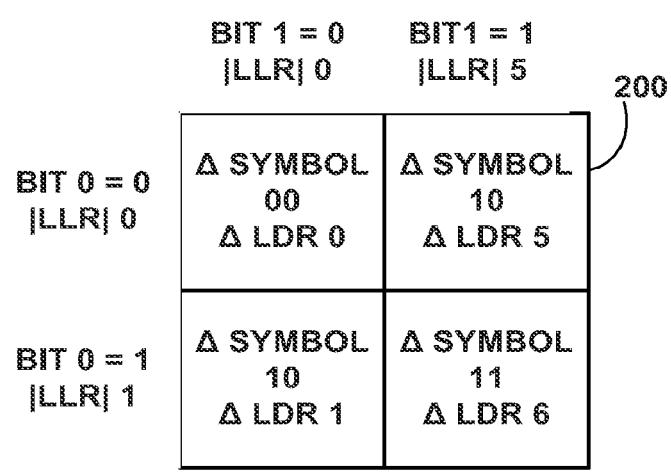
FIG. 2 schematically depicts an example of how reductions in log density ratio and symbol differences may be determined for possible combinations of two bits, in accordance with various embodiments.
Figure 3:
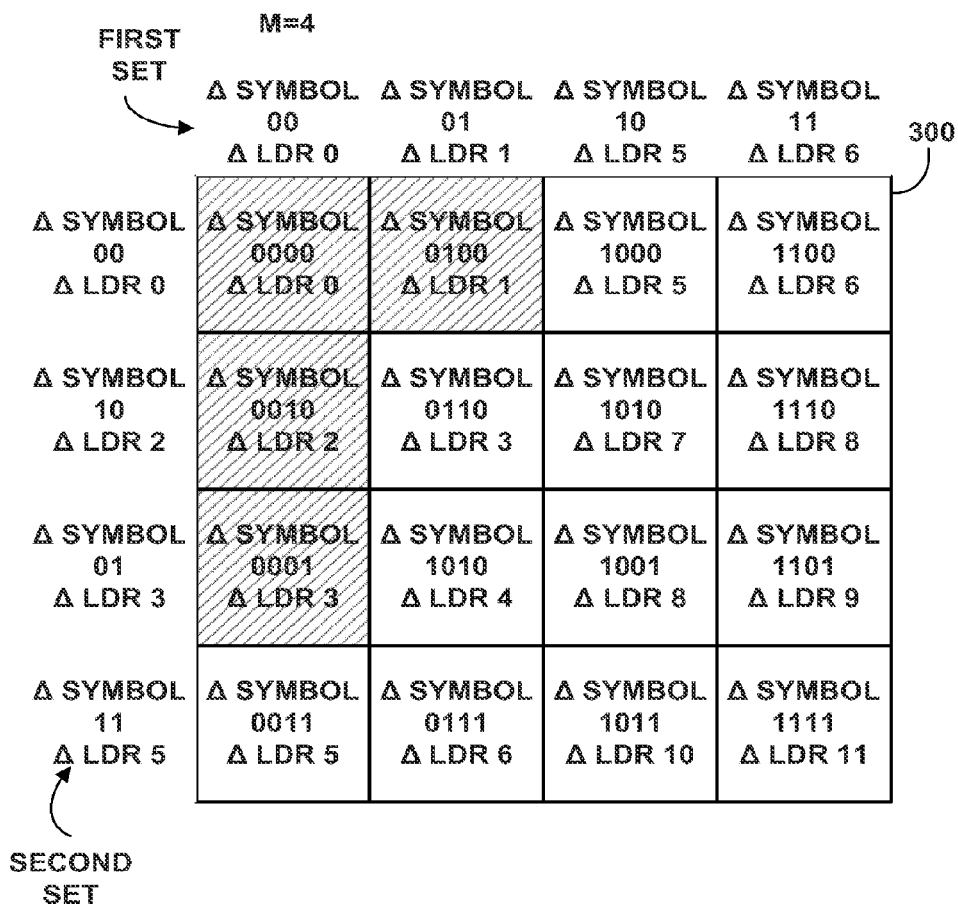
FIG. 3 schematically depicts an example of how combined reductions in log density ratio and combined symbol differences may be determined, in accordance with various embodiments.

An example of this is seen in FIGS. 2 and 3. A given two-bit subset of the x bits may represent four possible partial symbol differences: 00, 01, 10 and 11, and may be used to compute a first set of four "tuples." Each tuple in the first set may include a symbol difference and a reduction in log density ratio (<symbol difference, reduction in LDR>). An example of this is shown in the conceptual matrix 200 of FIG. 2, which includes four tuples having these combinations and their associated reductions in LDR. Possible values of a first bit of the two-bit subset may be represented by the columns of conceptual matrix 200. Possible values of a second bit of the two-bit subset may be represented by the rows of conceptual matrix 200. For the first bit, there may be a probability of |LLR|=0 that the first bit is a zero, and a probability of |LLR|=5 that the first bit is a one. For the second bit, there may be a probability of |LLR|=0 that the second bit is a zero, and a probability of |LLR|=1 that the second bit is a one.

For a two-bit subset such as the one depicted in FIG. 2, the partial symbol difference 00 may represent a reduction in LDR of 0, the partial symbol difference 01 may represent a reduction in LDR of $LLR_0$, the partial symbol difference 10 may represent a reduction in LDR of $LLR_1$, and the partial symbol difference 11 may represent a reduction in LDR of $LLR_1+LLR_0$. So in FIG. 2, for instance, the partial symbol difference 00 (top left) has a reduction in LDR of 0. The partial symbol difference 01 (bottom left) has a reduction in LDR of 1. The partial symbol difference 10 (top right) has a reduction in LDR of 5. The partial symbol difference 11 (bottom right) has a reduction in LDR of 6. Once the first set of tuples shown in conceptual matrix 200 is computed, in various embodiments, iterative decoder 12 may sort the first set of tuples, e.g., by their respective reductions in LDRs. In various embodiments, only the tuples representing the symbol differences 01 and 10 zero may need to be sorted against each other.

In various embodiments, iterative decoder 12 may compute a third set of tuples by comparing reductions in log density ratio of the first set of tuples with reductions in log density ratio of a second set of tuples associated with possible combinations of a second two-bit subset of the x bits (not shown in FIG. 2). Each tuple in the third set may include a combined symbol difference of a tuple from the first set and a tuple from the second set, and a combined reduction in LDR of the tuple from the first set and the tuple from the second set.

An example of this is seen in the conceptual matrix 300 of FIG. 3. The first set of tuples (depicted in FIG. 2) are sorted and represent the columns of conceptual matrix 300. A second set of tuples are sorted and represent the rows of conceptual matrix 300. The elements of the table may represent the combined symbol differences and combined reductions in LDR of the first and second sets. A combined symbol difference in this example may be a concatenation of the two symbols. For example, the combination of the first tuple of the first set (00) and the first tuple of the second set (00) yields the combined symbol difference (0000) shown in the top left square of conceptual matrix 300. A combined reduction in LDR may be a sum of the LDRs of each tuple.

In some embodiments, not all the tuples of conceptual matrices such as 200 or 300 may be computed. Rather, only tuples having the lowest reductions in LDR (e.g., the four shaded tuples in FIG. 3) may be computed. The conceptual matrices are included herein for illustrative purposes only, and are not required for updating variable nodes 22 as described herein.

Sets of tuples may be compared to other sets of tuples in this manner repeatedly, with each iteration producing a new set of tuples with combined symbol differences having more bits than the sets that were just compared. This process may be repeated until the number of bits in a combined symbol difference of each tuple is equal to x. At that point, the in tuples have the in lowest reductions in LDR may be determined.

For instance, in FIGS. 3, x=4 and m=4, and so four tuples having the lowest reductions in LDR (which means they may be closest to the symbol having the highest LDR), shown shaded in FIG. 3, may be selected. If in were instead equal to eight, then the eight tuples corresponding to the tuples in conceptual matrix 300 with less than eight tuples to the left and above would be selected. As will be described below, the combined symbol differences of these tuples may be XORed with the first combination of x bits having the highest LDR to produce in x-bit combinations having the highest LDRs.

On the other hand, if the number of bits in each combined symbol difference of the current set of tuples is less than x, then the process may continue. For example, in FIG. 3, if x were equal to eight, then tuples of the third set (e.g., in table 300) may be sorted and compared to similarly computed tuples of a fourth set of tuples (not shown) to compute a fifth set of tuples (not shown). As noted above, in some embodiments, not all tuples shown in the conceptual matrices are computed. For instance, in FIG. 3, only tuples of the third set corresponding to squares of conceptual matrix 300 with less than x tuples to the left and above may be computed. If x=8, then twelve tuples may be computed. In various embodiments those computed tuples may be sorted, and them tuples of the twelve having the lowest reductions in LDR may be compared to in similarly computed tuples of the fourth set of tuples (not shown) to compute the fifth set of tuples. This may continue until the number of bits in each combined symbol difference of a current set of tuples is equal to x.

Once the number of bits in each combined symbol difference of a current set of tuples is equal to x and in tuples having the lowest reductions in LDR are selected, in various embodiments, iterative decoder 12 may compute the in combinations of x bits having the highest probabilities by XORing the in combined symbol differences computed by iterative decoder 12 with the first combination of the x bits having a higher associated log density ratio than any other combination of the x bits. The combined symbol difference having the lowest reduction in LDR may include bits that are all equal to zero; XORing this symbol difference with the earlier computed combination of x bits having the highest LDR may yield the combination of x bits having the highest LDR. The other m−1 symbol differences will have at least one bit set to one, and so the XOR result of these symbol differences with the combination of x bits having the highest LDR may be the next m−1 combinations of x bits having the highest LDRs. In various embodiments, the LDR associated with a particular combination of the x bits may be computed by subtracting the reduction in LDR associated with the symbol difference that produced that combination of the x bits (e.g., by XOR) from the LDR of the first combination of x bits having the highest LDR.

In various embodiments, iterative decoder 12 may utilize the m combinations of x bits having the highest probabilities for various purposes, e.g., relating to the min-sum LDPC decoding algorithm. For example, in various embodiments, iterative decoder 12 may utilize the m combinations of x bits having the highest probabilities to update variable node 22 during iterative decoding.

In the examples described herein, sets having even numbers of tuples are computed and compared. However, this is not meant to be limiting, and sets of tuples of other sizes may be computed and/or compared.

Figure 4:
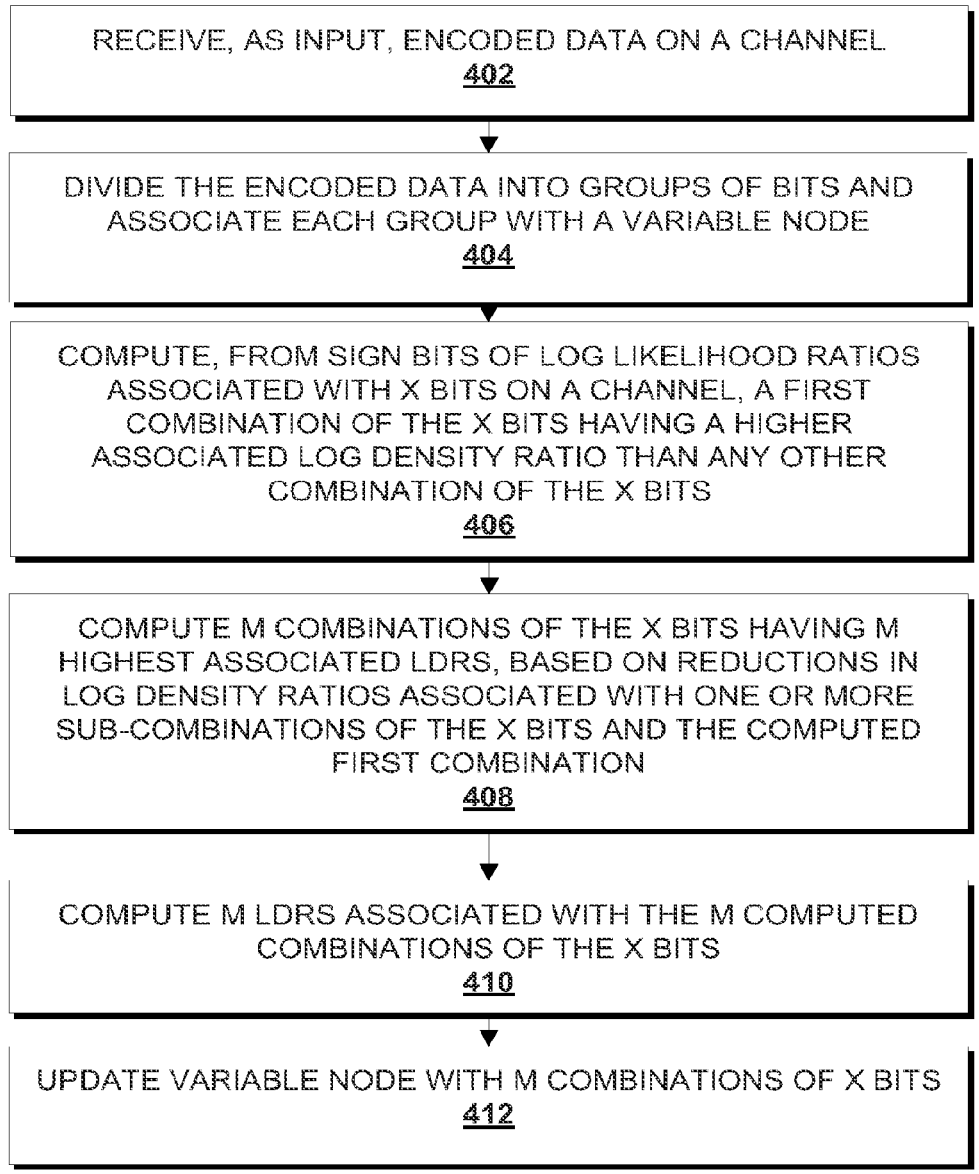
FIG. 4 schematically depicts an example method, in accordance with various embodiments.

FIG. 4 depicts an example method 400 that may be implemented, e.g., by an iterative decoder such as iterative decoder 12 of FIG. 1, to decode codewords on a channel (e.g., channel 14 in FIG. 1), in accordance with various embodiments. At block 402, iterative decoder 12 may receive, as input, encoded data on a channel 14. For example, and as discussed above, iterative decoder 12 may receive encoded data from NVM 16. At block 404, iterative decoder 12 may divide the encoded data into groups of bits and associate each group with a variable node 22. At block 406, iterative decoder 12 may compute, from sign bits of LLRs associated with x bits of the encoded data (e.g., one of the groups of bits or a portion of one of the groups of bits), a first combination of the x bits having a higher associated log density ratio than any other combination of the x bits. In some embodiments, the x bits may be a group of bits or a portion of a group of bits assigned to a particular variable node 22.

Figure 5:
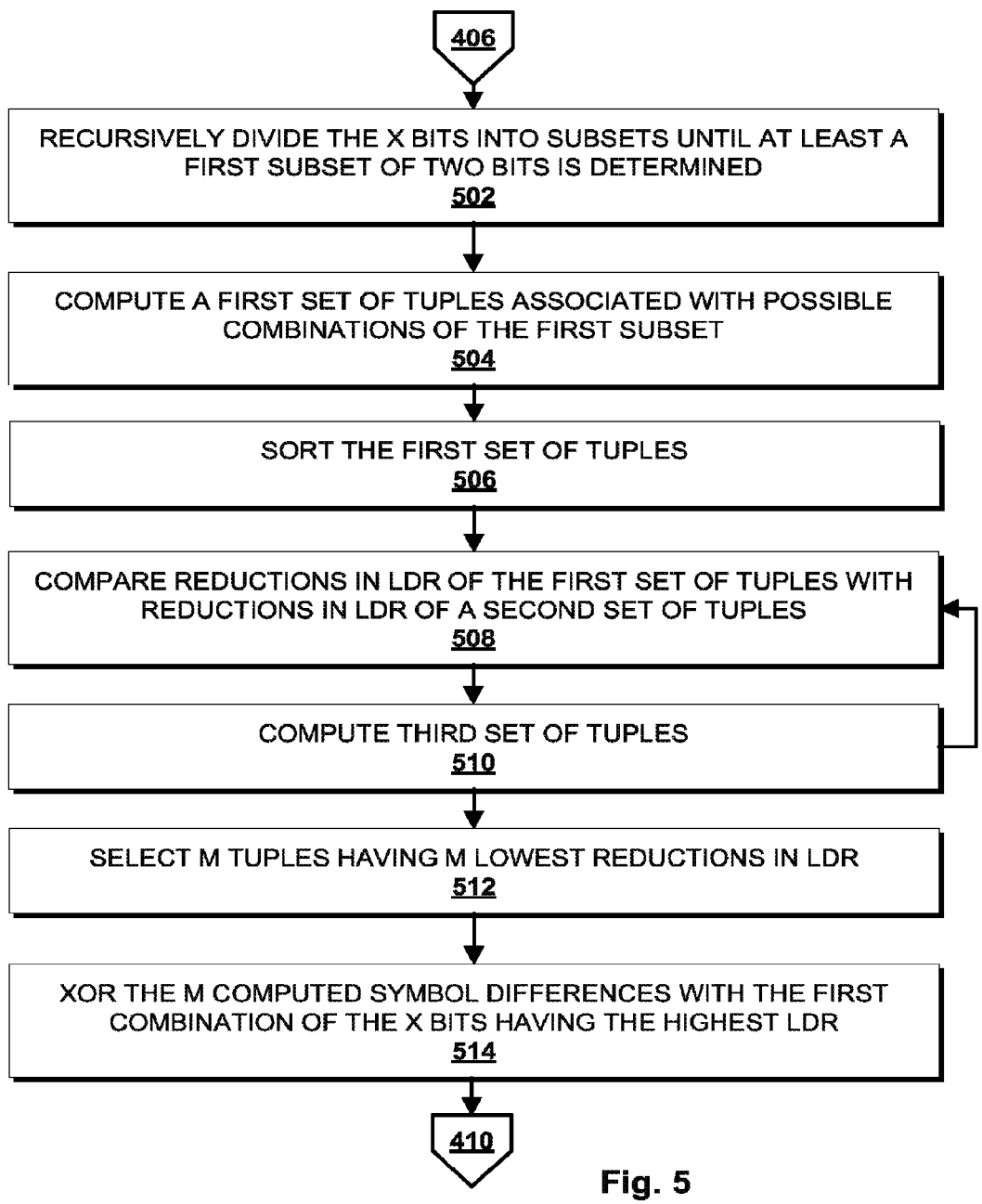
FIG. 5 depicts example operations that may form part of a method such as the one shown in FIG. 4, in accordance with various embodiments.

At block 408, iterative decoder 12 may compute m combinations of the x bits having m highest associated log density ratios, based on reductions in log density ratios associated with one or more sub-combinations of the x bits and on the computed first combination (as noted above, the m combinations of the x bits may include the first combination of bits computed at block 406). Block 408 may include various operations, examples of which are depicted in FIG. 5 (between blocks 406 and 410 in FIG. 5). In various embodiments, at block 410, iterative decoder 12 may compute m LDRs associated with the m computed combinations of x bits. For example, an LDR associated with a particular combination of the x bits may be computed by subtracting the reduction in LDR associated with the symbol difference that produced that combination of the x bits (e.g., by XOR) from the LDR of the first combination of x bits having the highest LDR. In various embodiments, at block 412, iterative decoder 12 may update a variable node 22 with the m combinations of the x bits computed at block 408.

Referring now to FIG. 5, various operations that may occur between block 406 and block 410 of FIG. 4 (e.g., those operations that collectively form block 408) are depicted. For example, at block 502, iterative decoder 12 may recursively divide the x bits into subsets until at least a first two-bit subset of the x bits is determined. At block 504, iterative decoder 12 may compute a first set of tuples associated with possible combinations of the first two-bit subset. In various embodiments, each tuple in the first set may include a symbol difference and a reduction in log density ratio. In various embodiments, at block 506, iterative decoder 12 may sort the first set of tuples, e.g., by their respective reductions in log density ratios.

In various embodiments, at block 508, iterative decoder 12 may compare reductions in LDR of the first set of tuples with reductions in LDR of a second set of tuples associated with possible combinations of a second two-bit subset of the x bits. At block 510, iterative decoder 12 may compute a third set of tuples from the first and second sets of tuples. Each tuple in the third set may include a combined symbol difference of a tuple from the first set and a tuple from the second set and a combined reduction in log density ratio of the tuple from the first set and the tuple from the second set.

As shown by the arrow, the operations represented by blocks 508 and 510 may be repeated until the number of bits in a symbol difference of a tuple in a current set of tuples is equal to x. Once that occurs, then at block 512, iterative decoder 12 may select m tuples from the current set of tuples with lowest combined reductions in log density ratios (meaning they are the closest to the combination of the x bits having the highest LDR, which was computed at block 406).

At block 514, iterative decoder 12 may XOR the m computed symbol differences with the first combination of the x bits to yield the m combinations of the x bits having m highest LDRs. In various embodiments, the method may proceed then to block 410 (FIG. 4).

Figure 6:
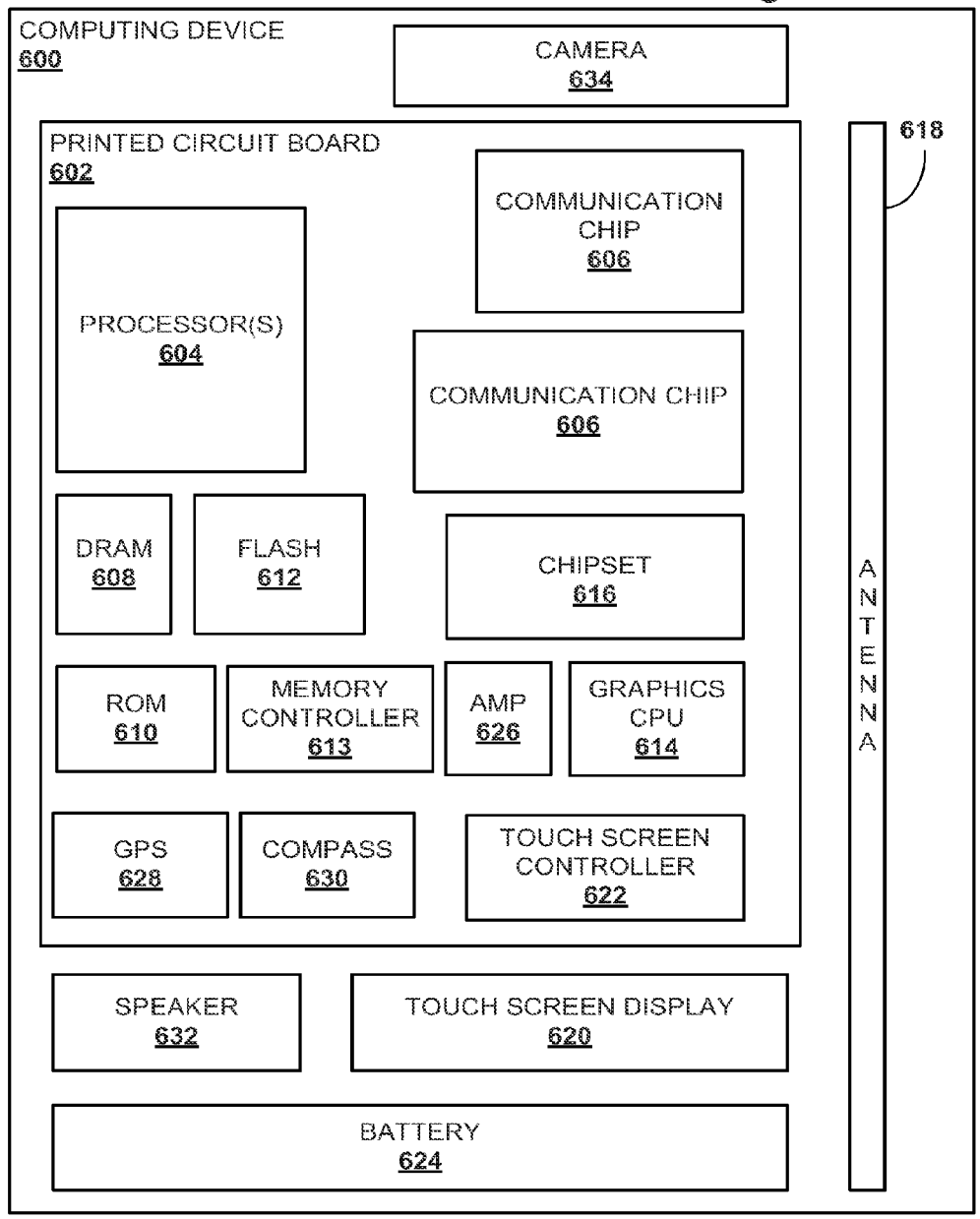
FIG. 6 schematically depicts an example computing device on which disclosed techniques may be implemented, in accordance with various embodiments.

FIG. 6 illustrates a computing device 600 in accordance with various embodiments. The computing device 600 houses a printed circuit board ("PCB") 602. The PCB 602 may include a number of components, including but not limited to a processor 604 and at least one communication chip 606. The processor 604 may be physically and electrically coupled to the PCB 602. In various embodiments, the at least one communication chip 606 may also be physically and electrically coupled to the PCB 602. In further implementations, the communication chip 606 may be part of the processor 604. In various embodiments, the processor 604 may be integrated on the same die with other components to form a System on Chip ("SoC").

Depending on its applications, computing device 600 may include other components that may or may not be physically and electrically coupled to the PCB 602. These other components include, but are not limited to, volatile memory (e.g., dynamic random access memory 608, also referred to as "DRAM"), non-volatile memory (e.g., read-only memory 610, also referred to as "ROM"), flash memory 612, a memory controller 613 (which may include or be operably coupled to an iterative decoder), a graphics processor 614, a digital signal processor (not shown), a crypto processor (not shown), a chipset 616, an antenna 618, a display (not shown), a touch screen display 620, a touch screen controller 622, a battery 624, an audio codec (not shown), a video codec (not shown), a power amplifier 626, a global positioning system ("GPS") device 628, a compass 630, an accelerometer (not shown), a gyroscope (not shown), a speaker 632, a camera 634, and a mass storage device (such as a hard disk drive, a solid state drive, a compact disk ("CD"), digital versatile disk ("DVD"))(not shown), and so forth.

The communication chip 606 may enable wired and/or wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, Long Term evolution ("LTE"), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 may include an integrated circuit die packaged within the processor 604. In various embodiments, the integrated circuit die of the processor 604 may include one or more devices, such as transistors or metal interconnects, that are formed to facilitate iterative decoding of codewords using one or more techniques described herein. The term "processor" may refer to any device or portion of a device that processes electronic data from registers and/or memory to transform that electronic data into other electronic data that may be stored in registers and/or memory.

The communication chip 606 may also include an integrated circuit die packaged within the communication chip 606. In various embodiments, the integrated circuit die of the communication chip 606 may include one or more devices, such as transistors or metal interconnects, that are formed to facilitate iterative decoding of codewords.

In various implementations, the computing device 600 may be a laptop, a netbook, a notebook, an ultrabook, a smart phone, a tablet, a personal digital assistant ("PDA"), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

The following paragraphs describe various embodiments. In various embodiments, an iterative decoder may be configured to compute, from sign bits of log likelihood ratios associated with x bits of a plurality of bits of encoded data, a first combination of the x bits having a higher associated log density ratio than any other combination of the x bits, x being a positive integer. In various embodiments, the iterative decoder may further be configured to compute m combinations of the x bits having m highest associated log density ratios, based on reductions in log density ratios associated with one or more sub-combinations of the x bits and the computed first combination of the x bits. In various embodiments, the iterative decoder may further be configured to update a variable node associated with the iterative decoder with the m combinations of the x bits.

In various embodiments, the iterative decoder may be further configured to compare reductions in log density ratios associated with one or more combinations of a first subset of the x bits with reductions in log density ratios associated with one or more combinations of a second subset of the x bits. In various embodiments, the iterative decoder may be further configured to recursively divide the x bits into subsets until at least a first two-bit subset of the x bits is determined.

In various embodiments, the iterative decoder may be further configured to compute a first set of tuples associated with possible combinations of the first two-bit subset of the x bits, each tuple in the first set including a symbol difference and a reduction in log density ratio. In various embodiments, the iterative decoder may be further configured to sort the first set of tuples by their respective reductions in log density ratios.

In various embodiments, the iterative decoder may be further configured to compare reductions in log density ratio of the first set of tuples with reductions in log density ratio of a second set of tuples associated with possible combinations of a second two-bit subset of the x bits. In various embodiments, the iterative decoder may be further configured to compute a third set of tuples, each tuple in the third set including a combined symbol difference of a tuple from the first set and a tuple from the second set and a combined reduction in log density ratio of the tuple from the first set and the tuple from the second set. In various embodiments, the iterative decoder may be further configured to compare combined reductions in log density ratio of the third set of tuples with combined reductions in log density ratio of a fourth set of tuples each tuple of the fourth set of tuples also including a combined symbol difference.

In various embodiments, the iterative decoder may be further configured to XOR the m computed symbol differences with the first combination of the x bits having a higher associated log density ratio than any other combination of the x bits. In various embodiments, the iterative decoder may be further configured to compute a log density ratio associated with at least one of the computed m combinations of the x bits by subtracting, from a log density ratio associated with the first combination of x bits having the higher associated log density ratio than any other combination of the x bits, a reduction in log density ratio associated with a symbol difference that produced the at least one of the computed m combinations of the x bits. In various embodiments, the iterative decoder may be a low-density parity-check decoder.

Computer-readable media (including non-transitory computer-readable media), methods, systems and devices for performing the above-described techniques are illustrative examples of embodiments disclosed herein.

Although certain embodiments have been illustrated and described herein for purposes of description, a wide variety of alternate and/or equivalent embodiments or implementations calculated to achieve the same purposes may be substituted for the embodiments shown and described. This application is intended to cover any adaptations or variations of the embodiments discussed herein. Therefore, it is manifestly intended that embodiments described herein be limited only by the claims and the equivalents thereof.

What is claimed is:
1. An apparatus, comprising:
a channel; and
an iterative decoder to decode a message on the channel, the message including a plurality of bits of data, the iterative decoder configured to:
compute, from sign bits of log likelihood ratios associated with x bits on the channel, a first combination of the x bits having a higher associated log density ratio than any other combination of the x bits, x being a positive integer;
compute m combinations of the x bits having m highest associated log density ratios, based on reductions in log density ratios associated with one or more sub-combinations of the x bits and the computed first combination of the x bits; and
update a variable node associated with the iterative decoder with the m combinations of the x bits.

2. The apparatus of claim 1, wherein the iterative decoder is further configured to compare reductions in log density ratios associated with one or more combinations of a first subset of the x bits with reductions in log density ratios associated with one or more combinations of a second subset of the x bits.

3. The apparatus of claim 1, wherein the iterative decoder is further configured to recursively divide the x bits into subsets until at least a first two-bit subset of the x bits is determined.

4. The apparatus of claim 3, wherein the iterative decoder is further configured to compute a first set of tuples associated with possible combinations of the first two-bit subset of the x bits, each tuple in the first set including a symbol difference and a reduction in log density ratio.

5. The apparatus of claim 4, wherein the iterative decoder is further configured to sort the first set of tuples by their respective reductions in log density ratios.

6. The apparatus of claim 5, wherein the iterative decoder is further configured to compare reductions in log density ratio of the first set of tuples with reductions in log density ratio of a second set of tuples associated with possible combinations of a second two-bit subset of the x bits.

7. The apparatus of claim 6, wherein the iterative decoder is further configured to compute a third set of tuples, each tuple in the third set including a combined symbol difference of a tuple from the first set and a tuple from the second set and a combined reduction in log density ratio of the tuple from the first set and the tuple from the second set.

8. The apparatus of claim 7, wherein the iterative decoder is further configured to compare combined reductions in log density ratio of the third set of tuples with combined reductions in log density ratio of a fourth set of tuples each tuple of the fourth set of tuples also including a combined symbol difference.

9. The apparatus of claim 1, wherein the iterative decoder is further configured to XOR the m computed symbol differences with the first combination of the x bits having a higher associated log density ratio than any other combination of the x bits.

10. The apparatus of claim 1, wherein the iterative decoder is further configured to compute a log density ratio associated with at least one of the computed m combinations of the x bits by subtracting, from a log density ratio associated with the first combination of x bits having the higher associated log density ratio than any other combination of the x bits, a reduction in log density ratio associated with a symbol difference that produced the at least one of the computed m combinations of the x bits.

11. The apparatus of claim 1, wherein the iterative decoder is a low-density parity-check decoder.

12. A computer-implemented method of updating a variable node associated with an iterative decoder of a computing device, comprising:
computing, by the iterative decoder of the computing device, from sign bits of log likelihood ratios associated with x bits on a channel, a first combination of the x bits having a higher associated log density ratio than any other combination of the x bits, x being a positive integer;
computing, by the iterative decoder, m combinations of the x bits having m highest associated log density ratios, based on reductions in log density ratios associated with one or more sub-combinations of the x bits and the computed first combination; and
updating the variable node with m combinations of the x bits.

13. The computer-implemented method of claim 12, wherein computing m combinations of the x bits having the highest associated log density ratios comprises comparing, by the iterative decoder, reductions in log density ratios associated with one or more combinations of a first subset of the x bits with reductions in log density ratios associated with one or more combinations of a second subset of the x bits.

14. The computer-implemented method of claim 12, wherein computing m combinations of the x bits having the highest associated log density ratios comprises recursively dividing, by the iterative decoder, the x bits into subsets until at least a first two-bit subset of the x bits is determined.

15. The computer-implemented method of claim 12, wherein the computing m combinations of the x bits having the highest associated log density ratios comprises XORing the m computed symbol differences with the first combination of the x bits.

16. The computer-implemented method of claim 12, further comprising computing, by the iterative decoder, a log density ratio associated with at least one of the computed m combinations of the x bits by subtracting, from a log density ratio associated with the first combination of x bits having the higher associated log density ratio than any other combination of the x bits, a reduction in log density ratio associated with a symbol difference that produced the at least one of the computed m combinations of the x bits.

17. A system, comprising:
non-volatile memory; and
a memory controller coupled with the non-volatile memory, and configured to:
compute, from sign bits of log likelihood ratios associated with x bits stored in the non-volatile memory, a first combination of the x bits having a higher associated log density ratio than any other combination of the x bits, x being a positive integer;
compute m x-bit symbol differences from the first combination of x bits, the m x-bit symbol differences having m lowest reductions in log density ratio from the log density ratio of the first combination of x bits; and
XOR the computed m x-bit symbol differences with the first combination of the x bits to compute m combinations of the x bits having m highest associated log density ratios.

18. The system of claim 17, wherein the memory controller is further configured to compare reductions in log density ratios associated with one or more combinations of a first subset of the x bits with reductions in log density ratios associated with one or more combinations of a second subset of the x bits.

19. The system of claim 17, wherein the memory controller is further configured to recursively divide the x bits into subsets until at least a first two-bit subset of the x bits is determined.

20. The system of claim 19, wherein the memory controller is further configured to compute a first set of tuples associated with possible combinations of the first two-bit subset of the x bits, each tuple in the first set including a symbol difference and a reduction in log density ratio; and sort the first set of tuples by their respective reductions in log density ratios.

21. The system of claim 20, wherein the memory controller is further configured to compare reductions in log density ratio of the first set of tuples with reductions in log density ratio of a second set of tuples associated with possible combinations of a second two-bit subset of the x bits.

22. The system of claim 21, wherein the memory controller is further configured to compute a third set of tuples, each tuple in the third set including a combined symbol difference of a tuple from the first set and a tuple from the second set and a combined reduction in log density ratio of the tuple from the first set and the tuple from the second set.

23. The system of claim 22, wherein the memory controller is further configured to compare combined reductions in log density ratio of the third set of tuples with combined reductions in log density ratio of a fourth set of tuples each tuple of the fourth set of tuples also including a combined symbol difference.

24. The system of claim 22, wherein the memory controller is further configured to XOR the m computed symbol differences with the first combination of the x bits having a higher associated log density ratio than any other combination of the x bits.

25. The system of claim 17, wherein the memory controller is further configured to compute a log density ratio associated with at least one of the computed m combinations of the x bits by subtracting, from a log density ratio associated with the first combination of x bits having the higher associated log density ratio than any other combination of the x bits, a reduction in log density ratio associated with a symbol difference that was used to produce the at least one of the computed m combinations of the x bits.

* * * * *